United States Patent  
Joshi et al.

(10) Patent No.: US 7,022,548 B2
(45) Date of Patent: Apr. 4, 2006

(54) METHOD FOR MAKING A SEMICONDUCTOR DIE PACKAGE

(75) Inventors: Rajeev Joshi, Cupertino, CA (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 45 days.

(21) Appl. No.: 10/744,849

(22) Filed: Dec. 22, 2003

(65) Prior Publication Data

US 2004/0137724 A1 Jul. 15, 2004

Related U.S. Application Data

(62) Division of application No. 09/881,787, filed on Jun. 15, 2001, now Pat. No. 6,683,375.

(51) Int. Cl.
*H01L 21/48* (2006.01)

(52) U.S. Cl. ............... 438/108; 438/106; 438/107; 438/611; 438/612

(58) Field of Classification Search ........ 435/108–106, 435/612–611; 257/690–693, 698, 730
See application file for complete search history.

(56) References Cited

U.S. PATENT DOCUMENTS

| 3,401,126 | A | 9/1968 | Miller et al. |
| 3,429,040 | A | 2/1969 | Miller |
| 4,545,610 | A | 10/1985 | Lakritz et al. |
| 4,980,753 | A | 12/1990 | Dunaway et al. |
| 5,092,036 | A | 3/1992 | Hu et al. |
| 5,284,796 | A | 2/1994 | Nakanishi et al. |
| 5,288,944 | A | 2/1994 | Bronson et al. |
| 5,329,423 | A | * 7/1994 | Scholz ............ 361/760 |
| 5,346,857 | A | 9/1994 | Scharr et al. |
| 5,355,283 | A | 10/1994 | Marrs et al. |
| 5,359,768 | A | 11/1994 | Haley |
| 5,515,604 | A | 5/1996 | Horine et al. |
| 5,536,362 | A | 7/1996 | Love et al. |
| 5,567,657 | A | 10/1996 | Wojnarowski et al. |
| 5,636,104 | A | 6/1997 | Oh |
| 5,639,696 | A | 6/1997 | Liang et al. |
| 5,641,990 | A | 6/1997 | Chiu |
| 5,678,287 | A | 10/1997 | Smith et al. |
| 5,710,062 | A | 1/1998 | Sawai et al. |
| 5,847,929 | A | 12/1998 | Bernier et al. |
| 6,013,571 | A | 1/2000 | Morrell |
| 6,060,769 | A | 5/2000 | Wark |
| 6,133,634 | A | 10/2000 | Joshi |
| 6,201,679 | B1 | 3/2001 | Richiuso |
| 6,251,707 | B1 | 6/2001 | Bernier et al. |
| 6,294,406 | B1 | 9/2001 | Bertin et al. |
| 6,307,755 | B1 | 10/2001 | Williams et al. |
| 6,339,191 | B1 | 1/2002 | Crane, Jr. et al. |
| 6,346,469 | B1 | 2/2002 | Greer |

(Continued)

FOREIGN PATENT DOCUMENTS

TW 309651 10/1997

*Primary Examiner*—Dung A. Le
(74) *Attorney, Agent, or Firm*—Townsend and Townsend and Crew LLP

(57) ABSTRACT

A method for processing a semiconductor substrate is disclosed. The method includes providing a mask having an aperture on a semiconductor substrate having a conductive region. An aperture in the mask is disposed over the conductive region. A pre-formed conductive column is placed in the aperture and is bonded to the conductive region.

13 Claims, 7 Drawing Sheets

U.S. PATENT DOCUMENTS

| | | |
|---|---|---|
| 6,372,553 B1 | 4/2002 | Briar |
| 6,391,687 B1 | 5/2002 | Cabahug et al. |
| 6,429,533 B1 | 8/2002 | Li et al. |
| 6,541,710 B1 * | 4/2003 | Deeney et al. ............... 174/255 |
| 6,847,118 B1 * | 1/2005 | Milewski et al. ........... 257/738 |
| 2002/0005591 A1 | 1/2002 | Lin |
| 2002/0070842 A1 | 6/2002 | Heaney |
| 2002/0100973 A1 | 8/2002 | Akram et al. |

* cited by examiner

METHOD FOR MAKING A SEMICONDUCTOR DIE PACKAGE

This application is a division of U.S. Ser. No. 09/881,787 Jun. 15, 2001, now U.S. Pat. No. 6,683,375.

BACKGROUND OF THE INVENTION

There are many different levels of packages and interconnections in state-of-the-art electronic packages. In a typical first level packaging process, a silicon die is joined to a ceramic substrate carrier. In a typical second level packaging process, the ceramic substrate carrier with the die is mounted on an organic board.

In one conventional method for forming a first level package, a passivation layer is formed on a semiconductor die (which may be in a semiconductor wafer). The passivation layer includes apertures that expose metal regions on the semiconductor die. Titanium and copper layers are sputtered on the upper surface of the conductive regions and the passivation layer. A layer of photoresist is then patterned on the semiconductor die so that the apertures in the patterned photoresist layer are over the conductive regions. Solder is electroplated in the apertures in the photoresist layer until the apertures are filled with solder. The photoresist is stripped and the portions of the titanium and copper layers around the solder deposits are removed. Then, the solder deposits are subjected to a full reflow process. The full reflow process causes the solder deposits to form solder balls. After forming the solder balls, the semiconductor die is bonded face-down to a carrier. The solder balls on the semiconductor die contact conductive regions on the chip carrier. Non-soluble barriers are disposed around the conductive regions and constrain the solder balls. The solder balls between the conductive regions on the carrier and the semiconductor die melt and wet the conductive regions on the carrier. Surface tension prevents the melting solder from completely collapsing and holds the semiconductor die suspended above the carrier.

While such conventional methods are effective in some instances, a number of improvements could be made. For example, during the reflow step, the deposited solder substantially deforms into solder balls. Because of the deformation, the heights of the resulting solder balls on the semiconductor die can be uneven. If the heights of the solder balls are uneven, the solder balls may not all contact the conductive regions of the carrier simultaneously when the semiconductor die is mounted to the chip carrier. If this happens, the strength of the formed solder joints may be weak thus potentially decreasing the reliability of the formed package. Also, the area of contact between the conductive regions and the solder balls are small, because the areas at the tips of the solder balls are small. It would be desirable to increase the area of contact between the solder and the carrier so that better conduction between the semiconductor die and the carrier occurs. Moreover, during the reflow process, the deposited solder is exposed to high temperatures for extended periods of time. Excessively heating the deposited solder can promote excessive intermetallic growth in the solder deposits. Intermetallics in the solder joints make the solder joints brittle and reduce the fatigue resistance of the solder joints. Lastly, performing a full reflow process takes time and energy and thus adds to the cost of the die package that is finally produced. If possible, it would be desirable to reduce the time and energy associated with the full reflow process.

Embodiments of the invention address these and other problems.

SUMMARY OF THE INVENTION

Embodiments of the invention include semiconductor die packages and methods for forming semiconductor die packages.

One embodiment of the invention is directed to a method for forming a semiconductor die package, the method comprising: a) providing a mask having an aperture on a semiconductor substrate, wherein a conductive region is on the semiconductor substrate and the aperture in the mask is disposed over the conductive region; b) placing a pre-formed conductive column within the aperture; and c) bonding the pre-formed conductive column to the conductive region, wherein the pre-formed conductive column has substantially the same shape before and after bonding.

A method for forming a semiconductor die package, the method comprising: a) forming a passivation layer comprising a first aperture on a semiconductor substrate comprising a conductive region, wherein the aperture in the mask is disposed over the conductive region; b) forming an adhesion layer on the passivation layer and on the conductive region; c) forming a seed layer on the adhesion layer; d) forming a patterned photoresist layer comprising a second aperture on the passivation layer, wherein the second aperture is over the conductive region and is aligned with the first aperture; e) electroplating a conductive layer within the second aperture and on the seed layer, f) depositing solder paste containing a flux within the second aperture and on the electroplated conductive layer; g) inserting a pre-formed conductive column into the second aperture; h) placing the pre-formed conductive column on the conductive layer within the second aperture; i) removing the patterned photoresist layer; j) etching portions of the adhesion layer and the seed layer disposed around the bonded pre-formed conductive column; and k) heating the solder paste to bond the pre-formed conductive column to the conductive region on the semiconductor substrate.

Another embodiment of the invention is directed to a method for forming a semiconductor die package, the method comprising: a) forming a mask comprising an aperture disposed over a conductive region on a semiconductor substrate, wherein the aperture is disposed over the conductive region; b) plating a conductive column within the second aperture and on the conductive region; and c) removing the mask from the semiconductor substrate.

Another embodiment of the invention is directed to a semiconductor die package comprising: a) a semiconductor die; b) a conductive region on the semiconductor substrate; c) a passivation layer comprising an aperture on the semiconductor substrate, wherein the aperture is disposed over the conductive region; and d) a pre-formed, conductive column comprising a lead-free, conductive columnar body and a coating on a conductive columnar body.

These and other embodiments of the invention are described in further detail below.

DESCRIPTION OF THE SPECIFIC EMBODIMENTS

Embodiments of the invention are directed to methods for forming semiconductor die packages. In embodiments of the invention, a mask having an aperture is provided on a semiconductor substrate. In some embodiments, the mask may be formed on the semiconductor substrate. For example, the mask may be a photoresist layer that is patterned on the semiconductor substrate. In other embodiments, the mask may be pre-formed. For instance, a mesh mask with apertures can be formed. Then, an aperture in the mesh mask can be aligned with the conductive region on the semiconductor substrate. Regardless of the type of mask used, when the mask is on the semiconductor substrate, the aperture in the mask is disposed over the conductive region and exposes the conductive region. A pre-formed conductive column is then placed within the aperture and is bonded to the conductive region. The mask may then be removed from the semiconductor substrate. Then, the semiconductor substrate can be diced to form individual dies. After dicing, the individual dies can be mounted on die carriers, lead frames, circuit substrates, etc.

The pre-formed conductive column can be bonded to the conductive region without performing a full reflow process. In embodiments of the invention, less time and/or less heat is needed to form an interconnect on a semiconductor substrate than the conventional solder ball formation process described above. Reducing the heating temperature and/or the heating time associated with forming an interconnect on a semiconductor substrate has a number of advantages. For example, by reducing the processing time and processing temperature, processing costs are reduced as less energy and time are needed to make the die package. Moreover, because less heat is needed to form interconnects on the semiconductor die, the likelihood that intermetallics will form in the interconnects is reduced or eliminated. This results in less brittle, and stronger interconnects and consequently a more reliable die package. Lastly, because a full reflow process is not performed, the conductive columns do not substantially deform like fully reflowed solder deposits. Consequently, the ends of the conductive columns are substantially coplanar. Good electrical contact can be made between the ends of the conductive columns and the conductive regions to which the ends are attached.

Figure 1A:
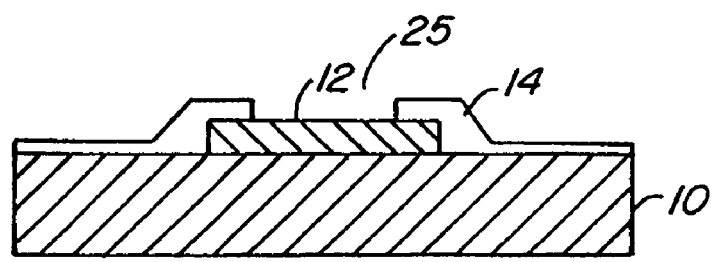
FIGS. 1(a) through 1(i) show simplified cross-sections of semiconductor substrates as they are processed according to an embodiment of the invention.

Embodiments of the invention can be described with reference to FIGS. 1(a) to 1(i). FIG. 1(a) shows a structure comprising a semiconductor substrate 10 and a conductive region 12 on the semiconductor substrate 10.

The conductive region 12 may be in any suitable form. For example, the conductive region 12 may be a circular or rectangular pad, or conductive line. Moreover, the conductive region 12 can comprise any suitable conductive material. For example, the conductive region 12 may comprise a metal such as aluminum, copper, nickel, gold, etc.

A passivation layer 14 is on the semiconductor substrate 10. The passivation layer 14 includes a first aperture 25 that is positioned over and exposes the conductive region 12. Any suitable material may used to form the passivation layer 14. Such materials may include, for example, silicon nitride, glass, or polymeric materials such as polyimide.

The semiconductor substrate 10 can include one or more semiconductor dies. In some embodiments, a semiconductor substrate is a silicon wafer that includes a plurality of semiconductor dies. The semiconductor dies may be separated from each other after the pre-formed conductive columns are bonded to each of the semiconductor dies in the semiconductor substrate 10. Any suitable semiconductor material including silicon, gallium arsenide, etc. can be used in the semiconductor substrate 10.

Figure 4:
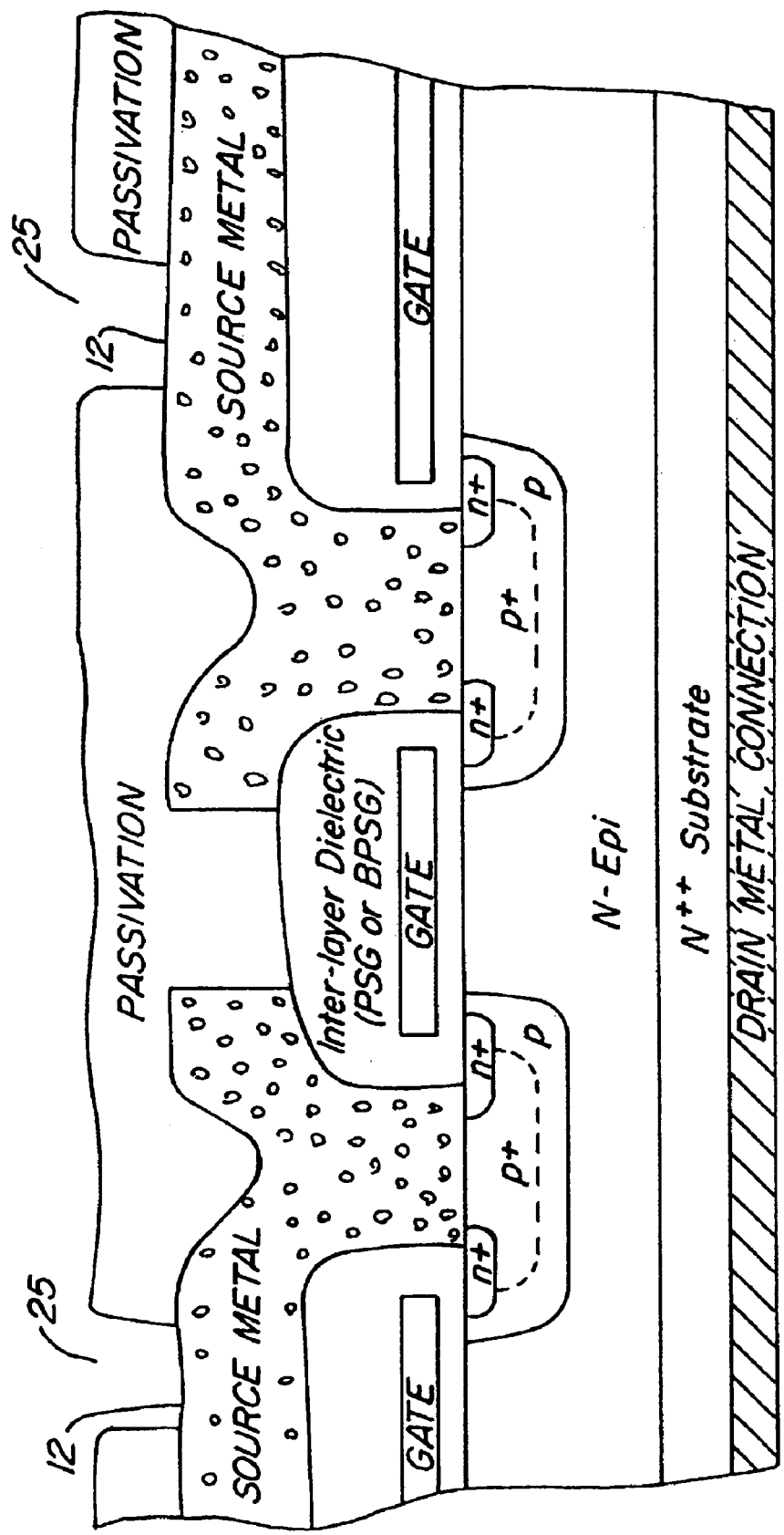
FIG. 4 shows a cross-section of a vertical MOSFET device.

The semiconductor substrate 10 and the one or more dies in the semiconductor substrate 10 may include any suitable active or passive semiconductor device. For example, the semiconductor substrate 10 may comprise a metal oxide field effect transistor (MOSFET) device such as a power MOSFET device. The MOSFET device may have planar or trenched gate structures. Trenched gate structures are preferred. Transistor cells containing trenched gate structures are narrower than planar gate structures. In addition, the MOSFET device may be a vertical MOSFET device. In a vertical MOSFET device, the source region and the drain region are at opposite sides of the semiconductor die so that current in the transistor flows vertically through the semiconductor die. A cross-section of a typical vertical MOSFET device is shown in FIG. 4.

FIG. 1(a) and other figures are simplified for purposes of illustration. For example, FIG. 1(a) shows one aperture in the passivation layer 14. However, it is understood that many conductive regions may be on the semiconductor substrate 10 and many apertures may be in the passivation layer 14 in embodiments of the invention. Consequently, many conductive columns can be bonded to the semiconductor substrate 10.

Figure 1B:
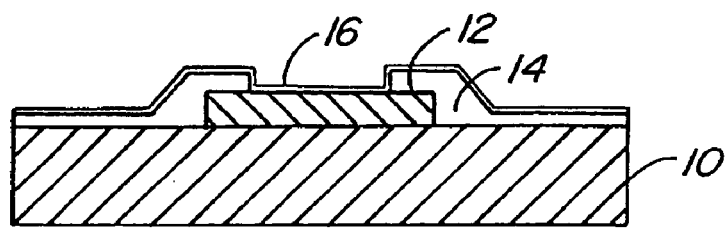

Referring to FIG. 1(b), an underlayer 16 of material can be deposited on the conductive region 12. The underlayer 16 can comprise any suitable number of sublayers. In some embodiments, the underlayer 16 may comprise one or more metallic sublayers. The metallic sublayers may comprise an adhesion layer, a diffusion barrier, a solder wettable layer, and an oxidation barrier layer. For example, the underlayer 16 may comprise a refractory metal or metal alloy layer such as a titanium (Ti) layer or titanium tungsten (TiW) layer. The underlayer 16 may also include a copper seed layer. The titanium layer or the titanium tungsten (TiW) layer may be used to adhere the copper seed layer to the conductive region 12, while the copper seed layer can be used to initiate a plating process.

The underlayer 16 and any sublayers thereof can be deposited on the semiconductor substrate 10 using any suitable method. For example, the layers may be deposited on the semiconductor substrate 10 by processes such as sputtering, electroless plating, or evaporation. Illustratively, a Ti or TiW layer having a thickness in the range of about 0.1 to about 0.2 micron can be sputtered over the entire surface of the passivation layer 14 and the conductive region 12 exposed through the passivation layer 14. Then, a copper or copper alloy layer of about 0.3 to about 0.8 microns can be sputtered on the Ti or TiW layer.

Figure 1C:
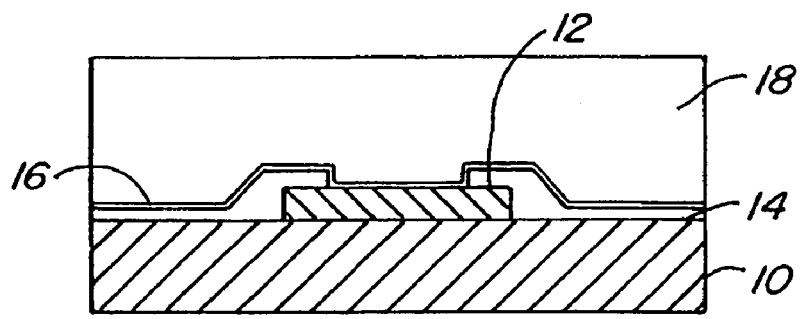
Figure 1D:
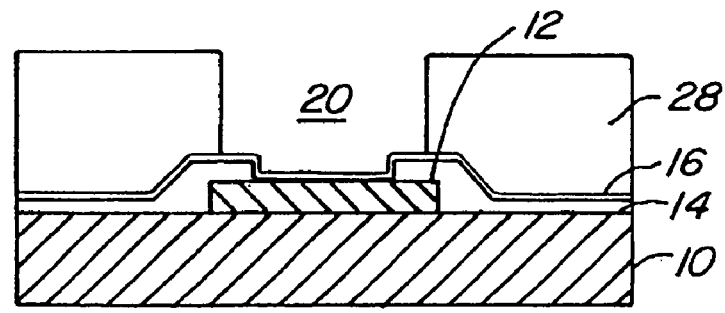

Referring to FIGS. 1(c) and 1(d), after depositing the underlayer 16 on the semiconductor substrate 10, a continuous photoresist layer 18 is deposited on the semiconductor substrate 10. A photolithography process can then be used to pattern the photoresist layer 18. For example, the photoresist layer 18 can be irradiated and then developed to form a mask 28. The mask 28 can include a second aperture 20. In this example, the second aperture 20 exposes a portion of the underlayer 16 and is positioned above the conductive region 12. Positive or negative photoresist materials may be used to form the mask 28.

Figure 1E:
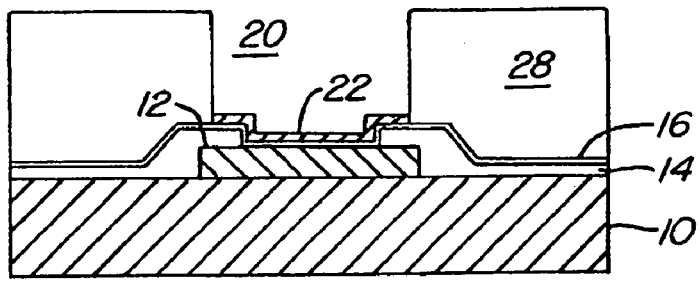

Referring to FIG. 1(e), after the mask 28 is formed on the semiconductor substrate 10, a copper layer 22 is deposited within the second aperture 20 and on the underlayer 16. The copper layer 22 may comprise copper or a copper alloy, and can be deposited on the underlayer 16 using any suitable process. For example, the copper layer 22 can be formed by electroplating. The thickness of the formed copper layer can be from about 10 to about 30 microns in some embodiments. Although copper is mentioned in this example, any suitable conductive material can be used instead of copper. For example, the copper layer 22 could alternatively be a gold layer or a nickel layer.

Figure 1F:
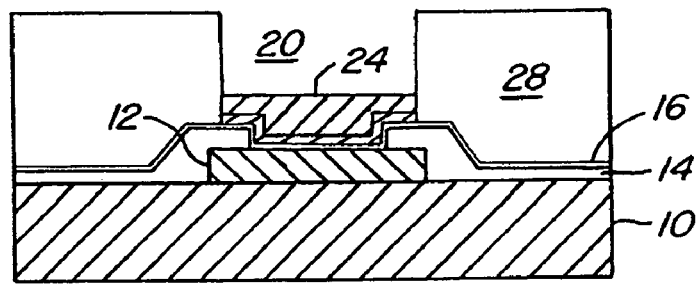

Referring to FIG. 1(f), after the copper layer 22 is formed on the conductive region 22 and within the second aperture 20, solder paste 24 is deposited within the second aperture 20. The solder paste 24 can comprise a carrier, a flux material, and metallic solder alloy particles. The solder paste 24 can be in the form of a layer with any suitable thickness. In some embodiments, the solder paste 24 can have a thickness less than a few microns (e.g., less than about 50 microns).

The solder particles in the solder paste 24 may include any suitable material. Exemplary solder materials may comprise PbSn, InSb, etc. in any suitable weight or atomic proportions. In some embodiments, the solder particles can comprise a standard eutectic solder composition (e.g., 63/37 PbSn).

Any suitable flux material can be used in the solder paste. For example, a rosin flux could be used. Rosin fluxes promote wetting of the metal surfaces by chemically reacting with oxide layers on the surfaces. After fluxing, oxide-free surfaces can readily wet with, for example, the melting solder. In a specific example, tin and lead oxides on PbSn solder particles can be removed using a rosin flux. Copper oxide on a copper pad can also be removed using a rosin flux. The melting solder particles can then contact and wet the oxide-free copper pad.

Figure 1G:
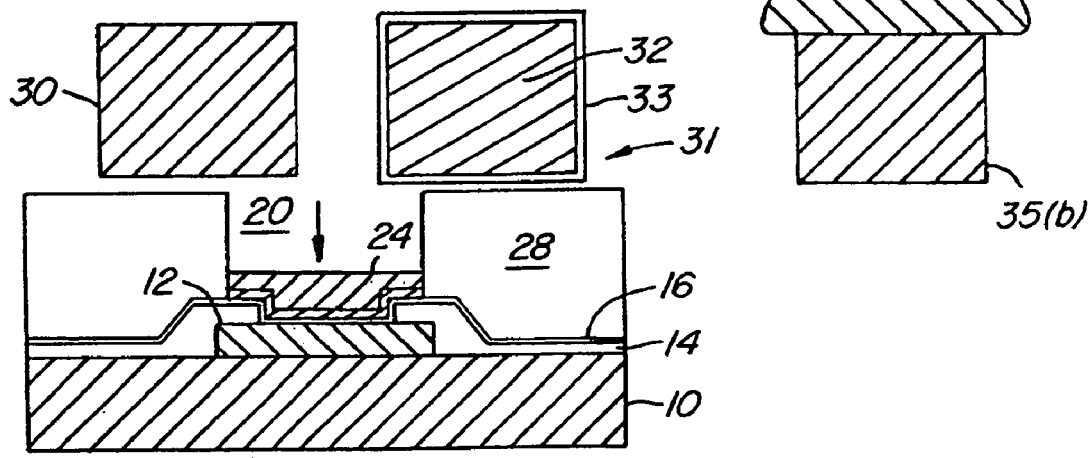

Referring to FIG. 1(g), after the solder paste 24 is deposited on the copper layer 22, a pre-formed conductive column 30, 31, 35 is then inserted into the second aperture 20 in the mask 28. In the illustrated embodiment, the pre-formed conductive column 30 contacts the solder paste 24 within the second aperture 20 and is immobilized on the solder paste 24. Other embodiments are also possible. For example, instead of the solder paste 24, a conductive adhesive layer could be used to bond the conductive column to the copper layer 22 and the conductive region 12.

The pre-formed conductive columns 30, 31, 35 can be in any suitable form. For example, the pre-formed conductive columns can have any suitable aspect ratio, where the aspect ratio can be defined as the longest cross-sectional length divided by the smallest cross-sectional width. The aspect ratio could be, e.g., greater than about 0.5 (e.g., about 1–2). Higher aspect ratio columns are desirable as they reduce the shear stress caused by mis-matches between the coefficients of thermal expansion (CTEs) of the semiconductor die and a die carrier upon which the semiconductor die is mounted. Moreover, the radial cross-sections of the columns can be circular, polygonal, etc. In some embodiments, the pre-formed conductive columns 30, 31, 35 can be cylinders or parallelepipeds such as cubes. In other embodiments, the pre-formed conductive columns may have a head and a stem so that the column has a mushroom-like shape. Before and after the conductive column 30, 31, 35 is bonded to the conductive region 12, the side walls of the conductive column 30, 31, 35 are substantially parallel to each other (unlike a solder ball).

Three different pre-formed conductive columns 30, 31 are shown in FIG. 1(g). One conductive column 30 can comprise a high lead (Pb) solder. A typical high lead solder can have a lead content that is greater than 63 percent by weight. For example, the high lead solder can comprise, for example, 95/5 PbSn or 90/10 PbSn (% by weight). A conductive column comprising a high lead solder can have a higher melting point than, for example, a eutectic solder composition (e.g., 63/37 PbSn). If the solder paste 24 under the conductive column 30 comprises solder particles made of a standard eutectic solder, the solder paste 24 can be heated between the melting temperatures of the eutectic solder and the high lead solder. The eutectic solder in the solder paste 24 can melt and bond the conductive column 30 to the conductive region 12 without melting the conductive column 30. Thus, the conductive column 30 retains its shape and the heights of the conductive columns that are bonded to the semiconductor substrate 10 are substantially co-planar.

Another conductive column 31 shown in FIG. 1(g) comprises a conductive columnar body 32 and a coating 33 on the conductive columnar body 32. In some embodiments, the conductive columnar body 33 and/or the coating 33 are lead-free. Reducing the amount of lead in the formed package makes the package more environmentally friendly. The coating 33 can be present on the top and bottom, and even on the sides of the conductive columnar body 32. The conductive columnar body 32 can comprise any suitable conductive material. Suitable conductive materials include copper, aluminum, and noble metals such as gold, silver, and alloys thereof. The coating 33 on the conductive columnar body 32 can include one or more layers of material. The one or more layers may include any suitable metallic layers. The metallic layers may include, for example, one or more of barrier layers, adhesion layers, diffusion barriers, and solder wettable layers. Layers such as these are sometimes referred to as "underbump metallurgy layers". Nickel and gold layers are two specific examples of metallic layers that can be on the columnar bodies.

A conductive column 35 having a head 35(a) and a stem 35(b) is also shown in FIG. 1(g). In this embodiment, the conductive column has a mushroom-like shape. The stem 35(b) can be inserted into the aperture 20 and can contact the solder paste 24 while the head 35(a) can remain above the mask 28. The conductive column 35 could comprise a high-lead solder. In other embodiments, the conductive column 35 may comprise a columnar body comprising, for example, copper and a coating on one, some, or all sides of the columnar body. The coating may include one or more of the previously described metallic layers.

The pre-formed conductive columns used in embodiments of the invention may be formed in any suitable manner. For example, in some embodiments, a long conductor may be formed by an extrusion process. The long conductor may then be cut to form individual columnar bodies. The formed columnar bodies can then be optionally coated with any suitable material. For example, columnar bodies can be plated with solder or one or more metallic layers. Each pre-formed conductive column can comprise a columnar body and a layer of material (e.g., solder) on it. Alternatively, the long conductor may first be coated and then cut. In other embodiments, the pre-formed conductive columns or the columnar bodies can be molded in a suitable mold.

Figure 1H:
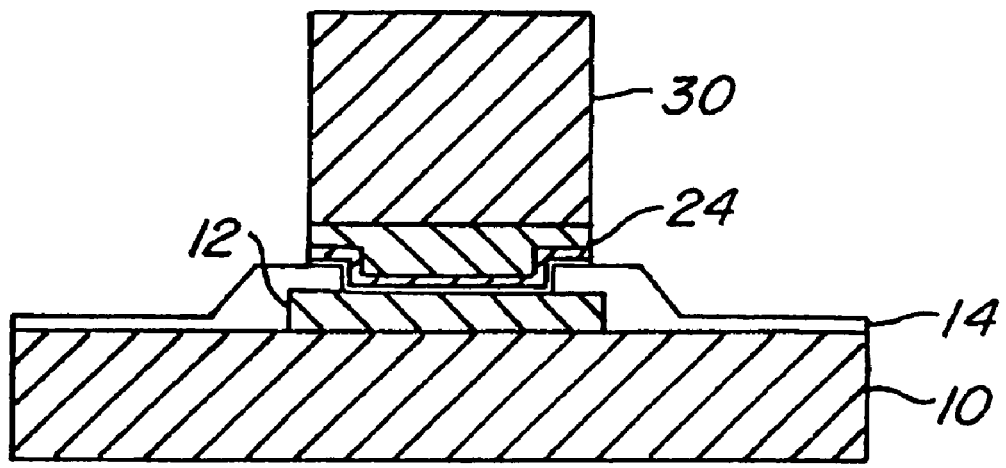

Referring to FIG. 1(h), after the conductive column 30 is placed on the solder paste 24, the mask 28 can be removed. The mask 28 can be removed using, for example, a standard stripping process. After the mask 28 is removed, the regions of the underlayer 16 around the conductive column 30 can be removed. The region of the underlayer 16 around the conductive column 30 can be removed using a brief etch. For example, these regions can be etched using a stripping solution of hydrogen peroxide. The brief etch process does not remove a substantial amount of the conductive column 30 so that the conductive column 30 remains on the semiconductor substrate 10 after the brief etch.

Figure 1I:
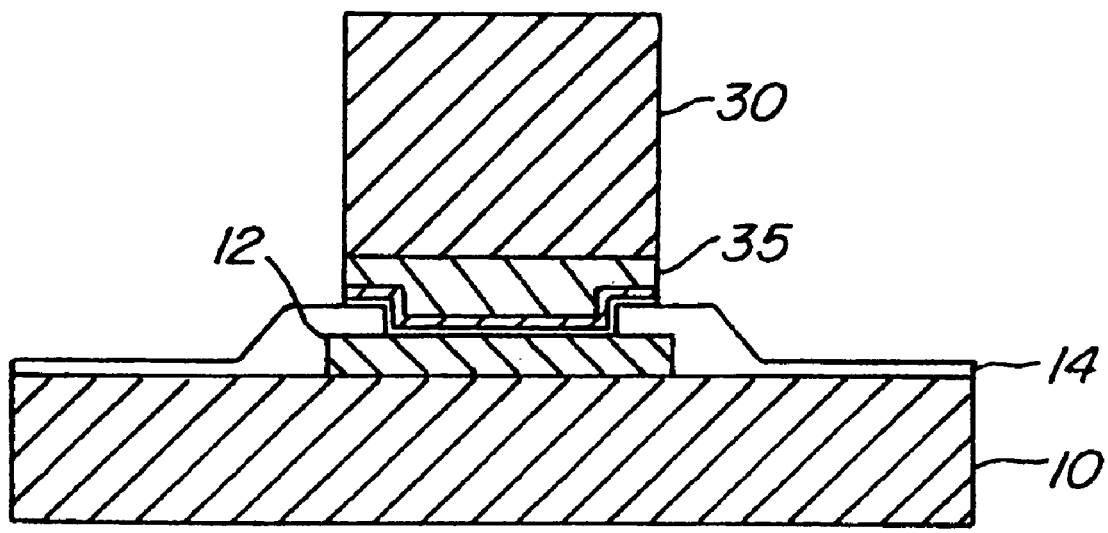

Referring to FIG. 1(i), after the mask 28 is removed, heat can be applied to solder paste 24 to form a solder joint 35. Flux in the solder paste 24 reacts with and removes oxides from the surfaces of the solder particles and the surfaces of the conductive column 30 and the copper layer 22. The solder particles in the solder paste 24 melt and solidify to form a complete solder joint 35. In this step, the amount of heat and the duration of heat that is applied to the solder joint 35 is less than the amount of heat and the heating time that is used to perform a full reflow process. In the illustrated embodiment, only the solder particles in the solder paste 24 need to melt to form a solder joint. During the formation of the solder joint 35, the pre-formed conductive column 30 does not deform in an appreciable manner. Less time and less energy is needed to form an interconnect such as the conductive column 30 on the semiconductor substrate 10 in comparison to a conventional solder ball process.

After the solder joint 35 is formed, any flux residue remaining around the solder joint 35 can be removed using conventional flux removal processes. If the semiconductor substrate 10 includes a plurality of semiconductor dies, the semiconductor substrate 10 can be diced. After dicing, individual semiconductor dies can be mounted on die carriers.

Embodiments of the invention are not limited to the particular order of process steps described above. For example, in some embodiments, the solder paste 24 can be heated to form a solder joint 35 before the mask 28 is removed. In another example, the underlayer 16 could be deposited on the conductive region 12 after the mask 28 is formed.

Figure 2A:
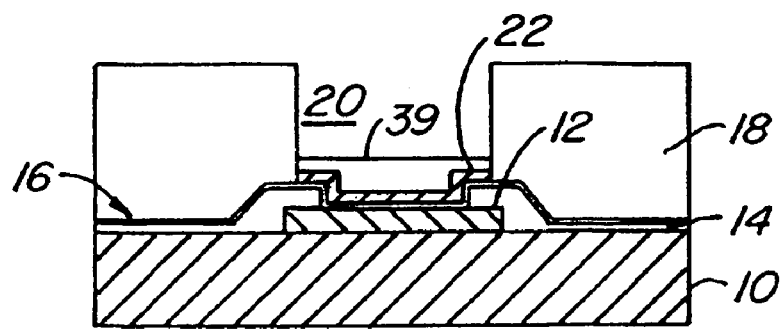
FIGS. 2(a) through 2(c) show simplified cross-sections of semiconductor substrates as they are processed according to another embodiment of the invention.

Other embodiments of the invention can be described with reference to FIGS. 2(a) to 2(c). In these embodiments, the processing steps that are described with respect to FIGS. 1(a) to 1(e) can first be performed. Then, referring to FIG. 2(a), a flux composition 39 (i.e., with or without solder particles) can be deposited on the conductive region 12. The deposited flux composition 39 is in contact with the copper layer 22. It can include any of the previously described flux materials.

Figure 2B:
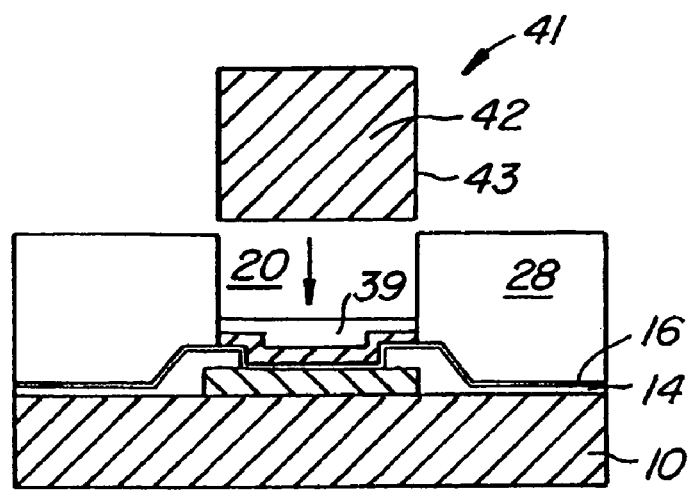

Referring to FIG. 2(b), after the flux composition 39 is deposited on the copper layer 22, a pre-formed conductive column 41 can be placed on the flux composition 39. The pre-formed conductive column 41 comprises a columnar body 42 and a solder coating 43 on the columnar body 42. The columnar body 42 can comprise a metal such as copper or gold. In some embodiments, the columnar body 42 is lead-free and has a high melting temperature (e.g., greater than 500° C.). Preferably, the solder in the solder coating 43 on the columnar body 42 has a lower melting temperature than the metal in the columnar body 42. The solder coating 43 can be on the top and the bottom, as well as on one or more of the sides of the columnar body 42. The pre-formed conductive column 41 could also have one or more of the previously described metallic layers (not shown) between the columnar body 42 and the solder coating 43.

The pre-formed conductive column 41 shown in FIG. 2(b) can be formed in any suitable manner. For example, in some embodiments, a long conductor may be formed by an extrusion process. The long conductor can then be optionally coated with solder using, for example, an electroplating process or a pultrusion process. In a pultrusion process, the long conductor having a rectangular or square cross-section can be pulled through a hole in a die. The hole has a larger cross-sectional area than the cross-sectional area of the long conductor. When the long conductor is pulled through the hole, solder on one side of the die can coat the long conductor as it is pulled through the hole. Then, the solder coated conductor can be cut to form individual, pre-formed columns. These pre-formed conductive columns can be mounted on conductive regions on a semiconductor substrate. Each conductive column includes a solder coating and an inner columnar body of metal.

After the pre-formed conductive column 42 is on the copper layer 22, the pre-formed conductive column 41 can then be heated so that the flux composition 39 and the portion of the solder coating 43 that contacts the flux composition 39 mix.

Figure 2C:
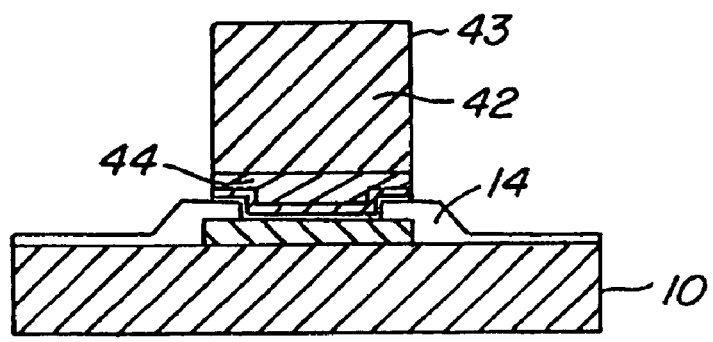

Referring to FIG. 2(c), after heating, the mixed solder coating 43 and the flux composition 39 can form a solder joint 44. The solder joint 44 binds the columnar body-42 to the conductive region. Before or after forming the solder joint, the mask 28 and the regions of the underlayer 16 around the solder joint 44 can be removed in the same or different manner as described above.

Using a pre-formed conductive column including a solder coated columnar body has a number of advantages. For example, the amount of lead (Pb) that is used in the pre-formed conductive column 41 is less than in an interconnect that is made of all solder (e.g., as in a solder ball). Accordingly, die packages that are made using the preformed conductive column 41 are more environmentally friendly than conventional solder ball-type die packages. Moreover, it is sometimes difficult to deposit solder paste into the small apertures in the mask 28 since solder paste is viscous. By having the solder in the pre-formed conductive column, the problems associated with depositing viscous solder paste within small apertures in a mask are reduced or eliminated.

Figure 3A:
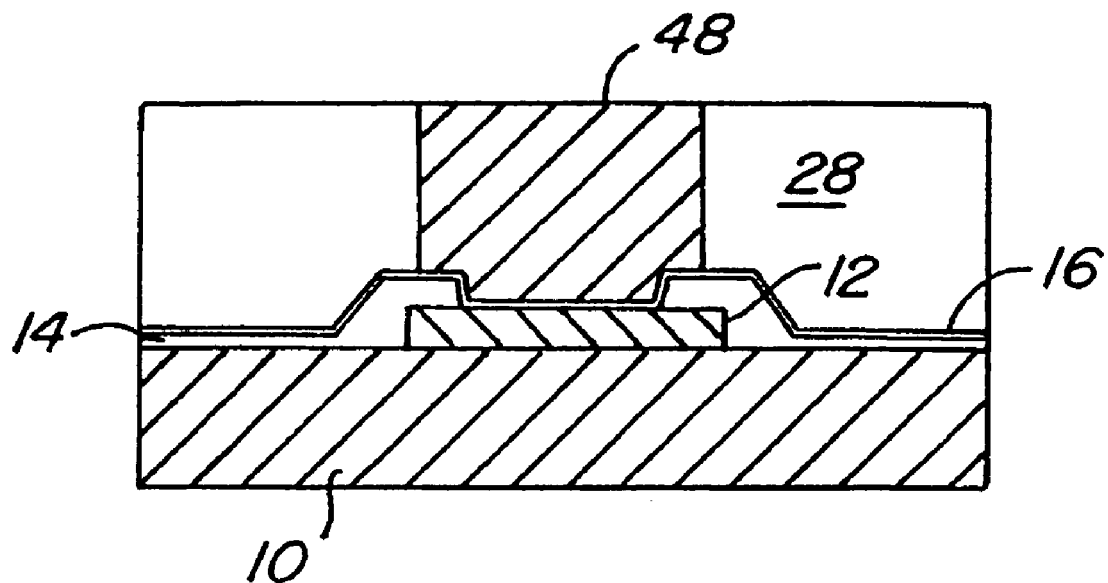
FIGS. 3(a) and 3(b) show simplified cross-sections of semiconductor substrates as they are processed in another embodiment of the invention.

Other embodiments can be described with reference to FIGS. 3(a) and 3(b). In these embodiments, the conductive column that is formed on the conductive region on the semiconductor substrate need not be pre-formed. For example, a conductive column can be formed on a conductive region of a semiconductor substrate by a process such as electroplating or electroless plating.

For instance, the processing steps that are shown in FIGS. 1(a) to 1(d) and that are described above with respect to FIGS. 1(a) to 1(d) can be performed. However, instead of forming a thin copper layer 22 on the conductive region 12 as in FIG. 1(e), plating continues so that a conductive column 48 is formed in the aperture 20 in the mask 28. The conductive column 48 can be formed by a plating process such as electroplating or electroless plating. Although copper is preferably used in the conductive column 48, other materials such as nickel or gold can be in the conductive column 48.

Figure 3B:
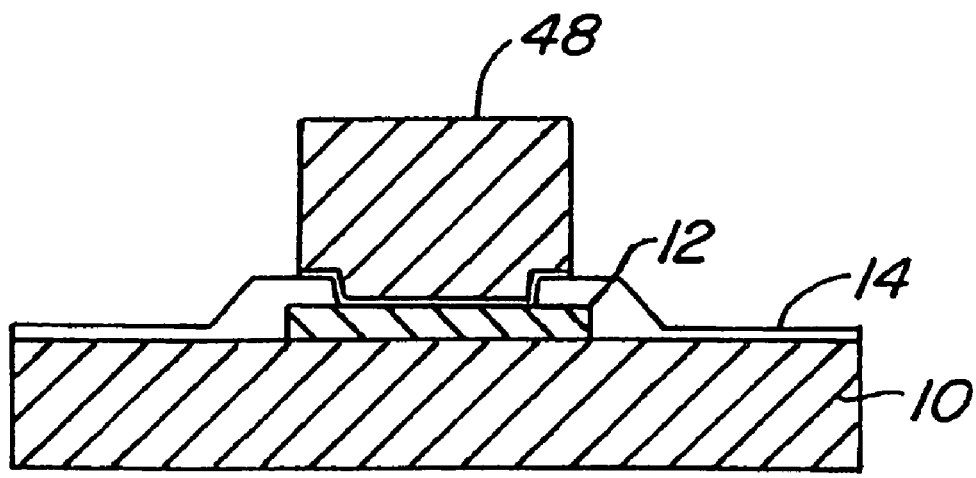

Referring to FIG. 3(b), after the conductive column 48 is formed, the mask 28 is then removed leaving a free-standing conductive column 48 on the semiconductor substrate 10. After removing the mask 28, regions of the underlayer 16 around the conductive column 48 can be removed in the same or different manner as described above. Then, the semiconductor substrate can be diced and the individual dies with the conductive columns can be mounted to, for example, die carriers.

The embodiment shown in FIGS. 3(*a*) and 3(*b*) has a number of advantages. For example, in this embodiment, the conductive column 48 is lead-free. The amount of lead in the formed package is reduced in comparison to many conventional packages, thus making the formed package more environmentally friendly than many conventional packages.

Figure 5:
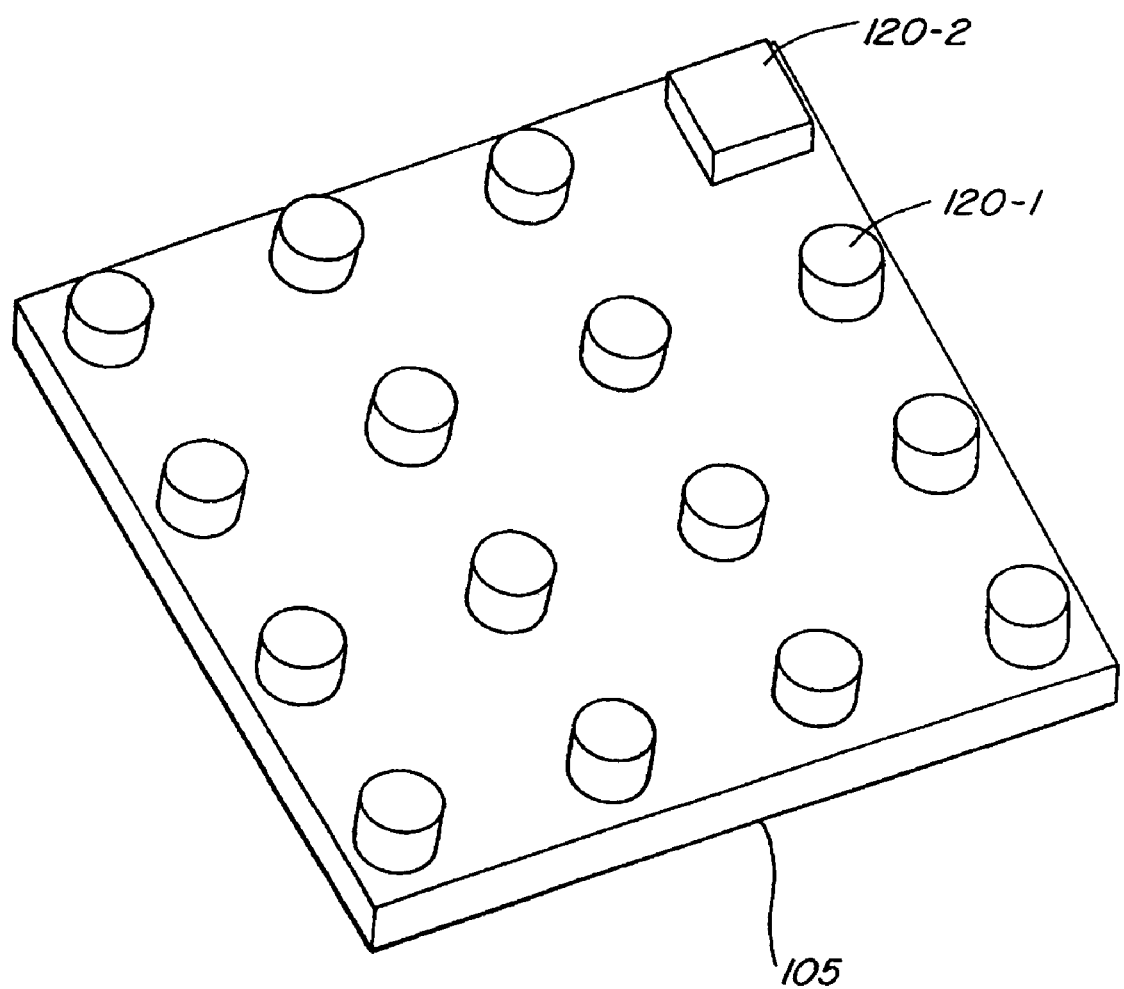
FIG. 5 shows the underside of a semiconductor die with the pre-formed conductive columns.

FIG. 5 shows the underside of a semiconductor die 105 with a plurality of conductive columns 120-1, 120-2 on it. As shown in FIG. 5, in embodiments of the invention, it is possible to have conductive columns with different cross-sectional geometries. For example, in the illustrated example, cylindrical conductive columns 120-1 can be coupled to the source regions of a vertical MOSFET device in the semiconductor die 105. A cubic conductive column 120-2 is at one corner of the semiconductor die 10 and can be coupled to the gate region of the MOSFET. The illustrated embodiment can be flipped over and then mounted to a die carrier, lead frame, circuit substrate, etc.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method for forming a semiconductor die package, the method comprising:
    a) providing a mask having an aperture on a semiconductor substrate, wherein a conductive region is on the semiconductor substrate and the aperture in the mask is disposed over the conductive region;
    b) placing a pre-formed conductive column within the aperture; and
    c) bonding the pre-formed conductive column to the conductive region, wherein the pre-formed conductive column has substantially the same shape before and after bonding.

2. The method of claim 1 wherein the aperture in the mask is a second aperture, and wherein the method further comprises, before a):
    d) forming a passivation layer having a first aperture on the semiconductor substrate, and
    wherein during b), the first aperture is over the conductive region and is aligned with the second aperture in the mask.

3. The method of claim 1 wherein the pre-formed conductive column comprises (i) a copper columnar body and a coating on the copper columnar body, or (ii) a solder column comprising PbSn.

4. The method of claim 1 wherein after bonding, the bonded conductive column has substantially the same shape before the pre-formed conductive column was bonded to the conductive region.

5. The method of claim 1 further comprising:
    d) depositing solder paste comprising a flux within the aperture in the mask, between a) and b).

6. The method of claim 1 wherein the pre-formed conductive column comprises (i) a copper columnar body and a coating on the copper columnar body, (ii) a solder column comprising PbSn, or (iii) a lead-free solder column.

7. The method of claim 1 wherein the mask comprises a mesh mask.

8. The method of claim 1 wherein the pre-formed conductive column comprises a columnar body comprising copper, and a layer of solder on the columnar body.

9. The method of claim 1 wherein the conductive column has the shape of a straight column or has a head and a stem.

10. A semiconductor die package made according to the method of claim 1.

11. A method for forming a semiconductor die package, the method comprising:
    a) forming a passivation layer comprising a first aperture on a conductive region on a semiconductor substrate, wherein the aperture in the mask is disposed over the conductive region;
    b) forming an adhesion layer on the passivation layer and on the conductive region;
    c) forming a seed layer on the adhesion layer;
    d) forming a patterned photoresist layer comprising a second aperture on the passivation layer, wherein the second aperture is over the conductive region and is aligned with the first aperture;
    e) electroplating a conductive layer within the second aperture and on the seed layer;
    f) depositing solder paste containing a flux within the second aperture and on the electroplated conductive layer;
    g) inserting a pre-formed conductive column into the second aperture;
    h) placing the pre-formed conductive column on the conductive layer within the second aperture;
    i) removing the patterned photoresist layer;
    j) etching portions of the adhesion layer and the seed layer disposed around the bonded pre-formed conductive column; and
    k) heating the solder paste to bond the pre-formed conductive column to the conductive region on the semiconductor substrate.

12. The method of claim 11 wherein the conductive column comprises a conductive columnar body having a coating on the columnar body.

13. The method of claim 11 wherein semiconductor substrate comprises a vertical metal oxide field effect transistor (MOSFET) device.

* * * * *